United States Patent [19]
Brown et al.

[11] Patent Number: 5,162,144
[45] Date of Patent: Nov. 10, 1992

[54] PROCESS FOR METALLIZING SUBSTRATES USING STARVED-REACTION METAL-OXIDE REDUCTION

[75] Inventors: Vernon L. Brown, Barrington; Julia S. Johnson, Schaumburg; Yaroslaw A. Magera, Arlington Heights, all of Ill.

[73] Assignee: Motorola, Inc., Schaumburg, Ill.

[21] Appl. No.: 739,269

[22] Filed: Aug. 1, 1991

[51] Int. Cl.[5] .......................... B32B 3/00; B05D 5/12; B44C 1/22; B29C 37/00
[52] U.S. Cl. ..................... 428/209; 156/643; 156/655; 156/668; 156/902; 427/98; 428/901
[58] Field of Search ............ 156/643, 651, 655, 659.1, 156/668, 667, 902; 428/148, 174, 209, 327, 328, 901; 427/96, 98, 307, 437

[56] References Cited

U.S. PATENT DOCUMENTS

| | | | |
|---|---|---|---|
| 4,564,424 | 1/1986 | Cassat et al. | 204/20 |
| 4,565,606 | 1/1986 | Cassat | 204/20 |
| 4,590,115 | 5/1986 | Cassat | 428/174 |

Primary Examiner—William A. Powell
Attorney, Agent, or Firm—Rolland R. Hackbart

[57] ABSTRACT

A unique process metallizes a substrate surface using a reducing agent including a borohydride to reduce, in a starved reaction, metal oxide particles (300) substantially uniformly distributed and at a controlled concentration in a particle-filled resin (204) to produce catalytic island areas (301). The catalytic island areas (301) formed have a surface resistivity greater than $10^6$ ohms per square. These catalytic island areas (301) are then electrolessly metallized to a predetermined thickness, such that adjacent catalytic island areas (301) are interconnected and form metallic features, such as pads, vias (213), and conductors (210, 211 and 212). The starved reaction limits the reduction of metal oxide particles (300) to catalytic island areas (301) and prevents migration of reduced metal beyond each of the exposed surfaces of particle-filled resin (204) which are to be metallized.

40 Claims, 2 Drawing Sheets

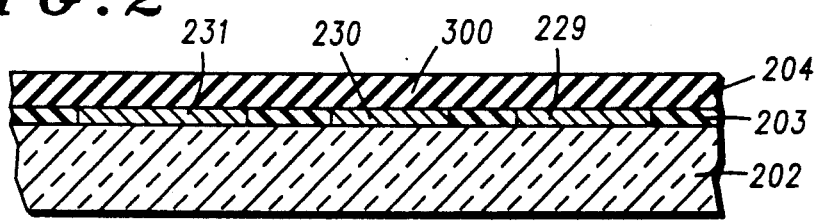
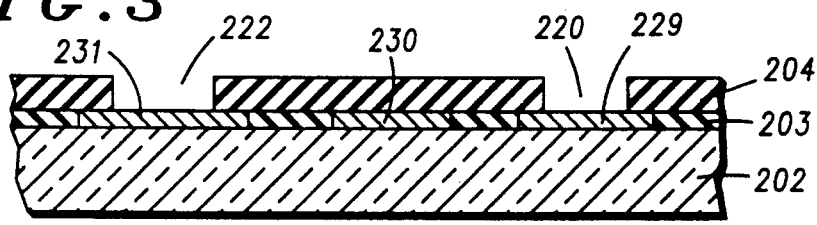
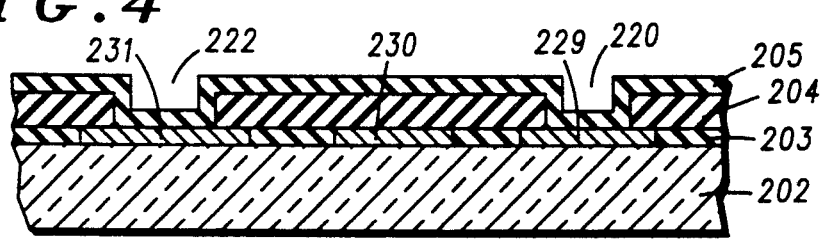
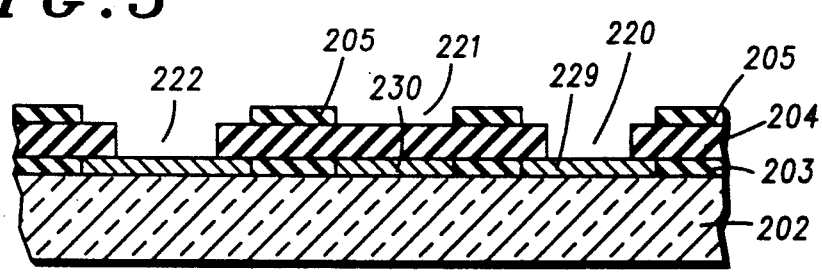
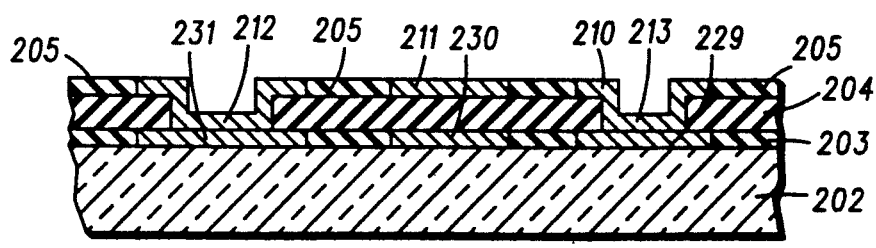

PROCESS FOR METALLIZING SUBSTRATES USING STARVED-REACTION METAL-OXIDE REDUCTION

BACKGROUND OF THE INVENTION

The present invention is generally related to processes for metallizing substrates, and more particularly to a starved-reaction metal-oxide reduction process for metallizing substrates having flat or three-dimensional surfaces.

A two-step dielectric process for manufacture of multilayered circuits (described in the instant assignee's copending U.S. patent application Ser. No. 07/461,857 entitled "Dielectric Layered Sequentially Processed Circuit Board", filed Jan. 8, 1990, and invented by Vernon L. Brown) requires the sequential deposition and photo-definition of openings in two resins. The first resin, called resin A, is filled with a material referred to herein as a filler, which when activated, will promote electroless plating with a metal. The second resin, called resin B, does not contain such a filler. When each resin, in turn, is photochemically patterned, resin B over resin A, openings produced in resin B define areas called "channels"; superimposed openings produced in resin A and resin B define deeper areas called "wells" which open to a metal layer below. When this structure is subjected to processes which modify or activate particles contained in or at the surface of resin A, the channels and wells may be coated with an electrolessly plated metal to form metallic features, such as pads, vias and conductors.

According to another process described in U.S. Pat. No. 4,590,115, a metal oxide, typically cuprous oxide, is the filler of choice for plating plastics, which are permeated with small particles of such cuprous oxide. Cuprous oxide becomes a catalyst through chemical reduction. This metal-oxide reduction process uses immersion in a borohydride solution to reduce the small cuprous oxide particles to metal both on and below the surface of the plastic substrate. While this metal-oxide reduction process exhibits very rapid and excellent copper coverage on the substrate surface, the process is not suitable for selective plating, such as, for example, the two-step dielectric process described hereinabove, since copper growth can not be confined to the defined openings in resin B. The undesired over-plating that results from this metal-oxide reduction process is due to the use of a large concentration of cuprous oxide in the resin and the use of a film or bath containing a large amount of the borohydride reducing agent, both of which promote uncontrolled metal film growth. Another problem, when using this metal-oxide reduction process in the two-step dielectric process described hereinabove, is that the dielectric constant of resin A, permeated with many small cuprous oxide particles, becomes relatively high due to the required large amount of cuprous oxide (e.g., 25-90% by weight). Furthermore, the large amount of cuprous oxide also interferes with photo-patterning and complicates resin coating, resin surface etching, and image development. Therefore, for the foregoing reasons, there is a need for an improved reduction process for selectively metallizing substrates without degrading the electrical and physical characteristics of the substrate.

SUMMARY OF THE INVENTION

The present invention encompasses a process for metallizing at least a first surface of a substrate. The novel process comprises the steps of: (a) forming a substrate with at least a first surface by substantially uniformly mixing a resin with a plurality of small metal oxide particles; (b) exposing the small metal oxide particles near the first surface; (c) applying a reducing agent including a borohydride to the first surface of the substrate for converting the exposed metal oxide particles to non-connected island areas of catalytic film each encompassing one or more metal oxide particles, such that the first surface has a surface resistivity greater than $10^6$ ohms per square; and (d) electrolessly metallizing the island areas of the first surface of said substrate to a predetermined thickness, whereby adjacent island areas are interconnected.

BRIEF DESCRIPTION OF THE DRAWINGS

FIG. 2 is a cross-sectional view of circuit board 100 in FIG. 1 taken along line A—A, during the manufacture thereof.

FIG. 3 is another cross-sectional view of circuit board 100 in FIG. 1 taken along line A—A, during the manufacture thereof.

FIG. 4 is another cross-sectional view of circuit board 100 in FIG. 1 taken along line A—A, during the manufacture thereof.

FIG. 5 is another cross-sectional view of circuit board 100 in FIG. 1 taken along line A—A, during the manufacture thereof.

FIG. 6 is another cross-sectional view of circuit board 100 in FIG. 1 taken along line A—A, during the manufacture thereof.

DESCRIPTION OF THE PREFERRED EMBODIMENT

Figure 1:
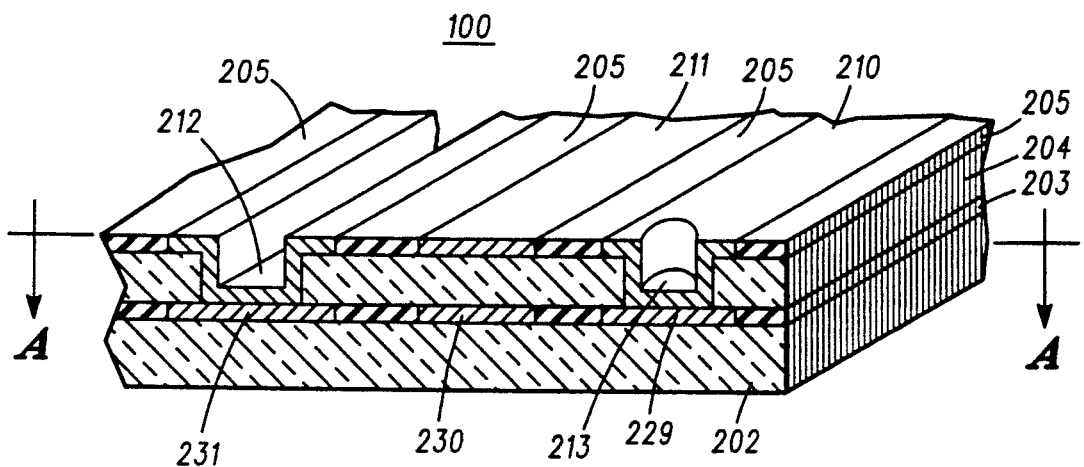
FIG. 1 is a partial perspective view of a circuit board 100, which has been selectively metallized by utilizing the process of the present invention.

Referring to FIG. 1, there is illustrated a partial perspective view of a circuit board 100, which has been selectively metallized by utilizing the process of the present invention. Circuit board 100 may be a multi-layer circuit board as illustrated, or may be a two-sided circuit board with circuitry on the top surface and the bottom surface. Furthermore, the process of the present invention may be used to metallize plastics and other conventional substrates, which have flat surfaces or three-dimensional surfaces.

Circuit board 100 in FIG. 1 includes conductors 210, 211, and 212 and is comprised of a substrate 202 having one or more circuitry layers 203, resin 204 disposed on circuitry layer 203, and resin 205 disposed on resin 204, as shown in more detail in the cross-sectional view in FIG. 6. Conductors 210 and 211 are disposed in corresponding openings or "channels" in resin 205 as shown in FIG. 1 and FIG. 6. Conductor 212 is disposed in a deep channel in resin 205 and resin 204 and electrically connects to conductor 231. Via 213 is disposed in an opening or "well" in resin 205 and resin 204 and electrically connects to conductor 229. Circuitry layer 203 includes conductors 229, 230 and 231.

Substrate 202 is comprised of an insulating material, such as, for example, plastic, wood, composite, mylar, ceramic, a metal covered by an insulating layer, or any other suitable insulating composition of matter. Resins 204 and 205 may be any suitable resin such as one of or a mixture of a thermoplastic resin, thermoset resin, elastomer, composite, or laminate, one of or a mixture of a polyolefin, vinyl, polystyrene, polyamide, acrylic, polyurethane, or saturated polyester thermoplastic resin, or one of or a mixture of a hardened phenolic, unsaturated polyester, epoxy, or polyimide prepolymer.

Figure 7:
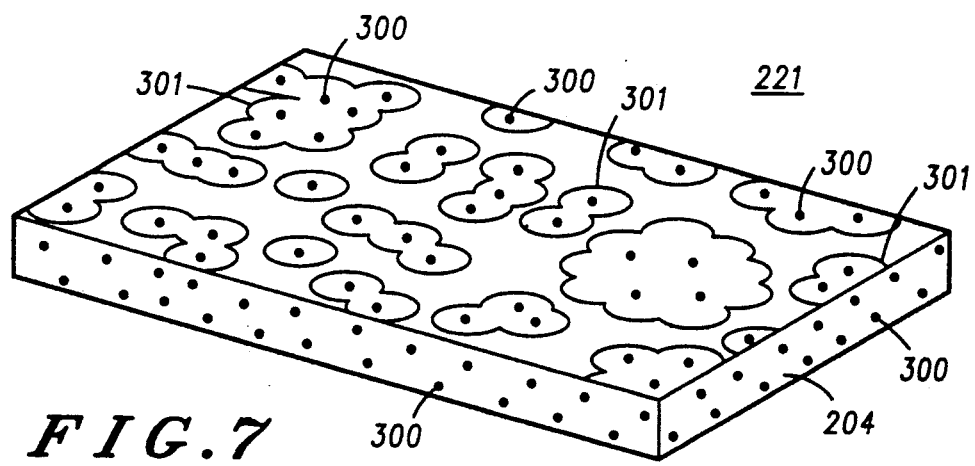
FIG. 7 is an enlarged view of the surface of channel 221 of the circuit board 100 in FIG. 5.

According to the present invention, resin 204 is substantially uniformly mixed with a plurality of small metal oxide particles such that the percentage by weight of said metal oxide is less than ten percent. When used in multi-layer circuit applications, resin 204 preferably has the following four characteristics: (1) no significant degradation of dielectric constant of the finished dielectric layer; (2) no significant degradation of bulk or surface resistivity away from areas which are plated; (3) no adverse effects on photochemical definition of the resin; and (4) no adverse effects on application or flow properties. In the preferred embodiment, cuprous oxide particles 300 in FIG. 7 are uniformly mixed with resin 204. Cuprous oxide has a dielectric constant of approximately 28. Resin 204 typically has a dielectric constant of approximately 2-5 without cuprous oxide, and a slightly higher dielectric constant when mixed with ten percent by weight of cuprous oxide. Although ten percent by weight of cuprous oxide is used in the preferred embodiment, a greater amount of cuprous oxide may be used in applications where the resultant increase in the dielectric constant of resin 204 is acceptable. Another suitable filler is CAT-10 manufactured and available from Johnson-Matthey in New Jersey, USA. However, cuprous oxide is preferable over CAT-10, since CAT-10 has a relatively long electroless plating initiation time and must be used in a relatively high concentration, degrading somewhat the dielectric constant and surface resistivity of the circuit board 100.

By utilizing the present invention, circuit boards 100 having conductors 210, 211, and 212 separated by approximately 25 micrometers may be manufactured. Using cuprous oxide particles substantially uniformly mixed in resin 204, the dielectric constant of circuit board is substantially the same as that of substrate 202 and the surface resistivity is at least $10^{13}$ ohms per square, since the percentage by weight of the cuprous oxide particles 300 is less than ten percent. Furthermore, very high density circuitry may be achieved, since the starved reduction of the exposed cuprous oxide particles 300 is limited to the island areas 301 on the exposed surfaces of resin 204 primarily due to little or no movement of the reactive solution onto resin 205 and also due to little or no extension of the reaction down into resin 204. In contrast, the prior art process described in U.S. Pat. No. 4,590,115 substantially alters the dielectric constant (approaching 28, the dielectric constant of cuprous oxide) of the substrate since the percentage by weight of the cuprous oxide particles is 25-90% by weight. Furthermore, the process allows and promotes the dissolution and movement of reactive compound along the substrate surface producing a non-selective metal surface.

Referring to FIG. 2-6, there is illustrated a cross-sectional view of circuit board 100 in FIG. 1 taken along line A—A, showing circuit board 100 at selected stages during the manufacture thereof, where FIG. 6 corresponds to completed circuit board 100 in FIG. 1. First, as shown in FIG. 2, substrate 202 is metallized to form circuitry layer 203 or a preformed circuitry layer 203 is attached thereto, with conductors 229, 230 and 231. Next, substrate 202 and circuitry layer 203 are coated with resin 204. In the preferred embodiment, resin 204 is resin A of the aforementioned two-step dielectric process. Resin 204 is formed by uniformly mixing a selected resin with a plurality of small metal oxide particles 300 in FIG. 7, such that the percentage by weight of said metal oxide is less than ten percent. In the preferred embodiment, resin 204 is selected from the resins described hereinabove, and the metal-oxide particles 300 are cuprous oxide particles which preferably range in size from a diameter of 0.05 micrometers to a diameter of 10 micrometers.

In FIG. 3, resin 204 is photo-patterned creating channel 222 and well 220 exposing corresponding conductors 231 and 229, respectively, of circuitry layer 203. In FIG. 4, resin 204, channel 222 and well 220 are coated with resin 205. In the preferred embodiment, resin 205 is resin B of the aforementioned two-step dielectric process and likewise is selected from the resins described hereinabove. In FIG. 5, resin 205 is photo-patterned creating channel 221 and re-opening channel 222 and well 220. Next, the metal oxide particles 300 near the exposed surface of resin 204 (see FIG. 7) are exposed by a suitable treatment, such as reactive ion etching. Then, a reducing agent including a borohydride is applied in a starved manner (explained in more detail hereinbelow) by spraying (or other suitable application means) the surface of channels 221 and 222 and well 220 to convert the exposed metal oxide particles 300 at the surface of resin 204 to island areas 301 of catalytic film having a surface resistivity greater than $10^6$ ohms per square. Thereafter, channels 221 and 222 and well 220 are suitably treated and electrolessly metallized to form conductors 210, 211 and 212 and via 213 in FIG. 1 and FIG. 6, having a surface metallization thickness of approximately 10 micrometers.

In the preferred embodiment, metal oxide particles 300 uniformly distributed in resin 204 are small cuprous oxide particles 300 having a typical diameter ranging from 0.05 to 10 micrometers and used in an amount such that the percentage by weight of resin is less than 10%. Variation in the diameter of cuprous oxide particles 300 is introduced in part by the grinding process used to produce them. In other embodiments, metal oxide particles 300 may be comprised of nickel, silver, or any other suitable metal, and the typical diameter may extend outside the range of 0.05 to 10 micrometers and the percentage by weight of resin may be greater than ten percent. By limiting the amount of cuprous oxide particles 300 at the exposed surface of resin 204 to less than 10%, only enough cuprous oxide is present to produce the small electroless plating cells which exist, during a subsequent reduction, in situ around such cuprous oxide particles 300, with ionic compounds and/or atomic metal which subsequently spreads creating small island areas 301 and does not migrate outside the bounds of desired areas, such as 220, 221, and 222 of FIG. 5. Thus, according to a feature of the present invention, enough cuprous oxide is provided such that the exposed surface of resin 204 is nearly, but not completely, covered, following reduction, with non-connected island areas 301 of catalytic film each encompassing one or more cuprous oxide particles 300. In other words, the process is starved due to the amount of cuprous oxide that is provided. This starved coverage, after reduction of the cuprous oxide with a borohydride solution, has a relatively high surface resistivity (i.e. exceeding $10^6$ ohms per square) indicating that such island areas 301 of catalytic film are on the surface, as illustrated in FIG. 7. For example, the surface resistivity after cuprous oxide reduction is believed to be approximately 100 megohms for 10% cuprous oxide. The resulting surface resistivity is a function which is dependent, in part, upon concentration and particle size of the cuprous oxide. Even though the reduced surface of resin 204 has a resistivity exceeding $10^6$ ohms per square, there are enough island areas 301 of catalytic film such that very rapid electroless copper plating occurs when circuit board 100 is immersed in an electroless copper bath, such as, for example, PCK's 600 chemistry.

In a selective plating process such as the aforementioned two-step dielectric process, it is very important to limit the migration of the reduced metal to the desired areas to be metallized, since all areas covered by reduced metal will be metallized during the following electroless plating process. The process may also be starved due to the amount or concentration of the reducing agent that is provided. The amount of reducing agent delivered to the surface and its concentration may be controlled either individually or together to limit the reduction reaction to the exposed surfaces of layer 204 in FIG. 5 and prevent migration of reduced metal beyond each of such surfaces to other surfaces, such as, for example, migration of reduced metal from the surface of channel 221 to the surface of layer 205 or via the surface of layer 205 to the surface of channel 222 of FIG. 5. In practicing the starved process, potassium borohydride $KBH_4$ or sodium borohydride $NaBH_4$ operated at a controlled pH is sufficient, alone, to reduce cuprous oxide particles 300 and create island areas 301. For example, a suitable range of the borohydride pH is 9–11.5.

The conversion of cuprous oxide particles 300 by a borohydride is represented by the following chemical reaction:

where three of the hydrogen atoms which comprise the borohydride ion $BH_4-$ of an unsubstituted alkali metal borohydride or a substituted borohydride have been replaced by inert substituents. In the preferred embodiment, an aqueous solution is used which contains from 0.01 to 10 moles per liter sodium borohydride at a pH from 9 to 11.5. Following coating (or molding or casting) of resin 205 deposited in FIG. 4, and photo-defined as shown in FIG. 5, cuprous oxide particles 300 are exposed and chemically activated by etching, such as, for example, chemical etching or reactive ion etching in a plasma. This treatment may be accomplished by other conventional etching means as well. Thereafter, the etched circuit board 100 in FIG. 5 is cleaned in a solvent and water spray to remove loose particles generated by the etching process.

According to a feature of the present invention, application of the reducing agent involves the application of a controlled amount and composition of a borohydride solution to the exposed cuprous oxide particles 300 on the exposed surfaces of resin 204 in channels 221 and 222 and well 220. In the preferred embodiment, the application of the reducing agent is implemented by spraying of an aqueous solution including the reducing agent. The flow rate, duration, and pressure of the spray as well as the composition of such aqueous solution are selected and controlled such that reduction begins with cuprous oxide particles 300 at the point of impingement of spray droplets and continues to other nearby particles as the fluid spreads across the surface for relatively small distances. The aqueous solution including the reducing agent may also be applied by painting, mist, or other suitable means. The concentration of the borohydride and pH change of the reducing agent dissipates as the aqueous solution moves across the surface, with spent reactant becoming unable to either reduce additional cuprous oxide particles 300 or dissolve and carry copper intermediates any significant distance beyond a small area around each particle 300, called the spray impingement area. As a result, the reduction process is starved since dissolved copper products and active borohydride reactants are not carried in solution onto adjacent surfaces or from one exposed area on the surface of resin 204 to others, where further reduction of cuprous oxide particles 300 would produce additional reduced metal oxide areas on layer 205, both causing electrical shorts between conductors 210 and 211 or 211 and 212 when electrolessly plated. After application of the reducing agent, circuit board 100 is rinsed with water.

Following cuprous oxide reduction, circuit board 100 is electrolessly metallized by plating in an electroless copper, nickel, or other suitable metallic (e.g. cobalt, chromium iron, silver, gold, vanadium, cobalt/nickel alloy, or brass) electroless bath for a time sufficient to produce the desired metallic thickness. For example, in multi-layer circuit applications, the metallization preferably has a thickness of at least 4 micrometers. Since the island areas 301 are copper or catalytic compounds of copper in the preferred embodiment, electroless metallization is deposited relatively quickly (e.g. approximately 30 minutes for a thickness of at least 4 micrometers). In other applications, the thickness of the metallization may be greater.

In summary, a unique process metallizes at least a first surface of a particle-filled substrate using a reducing agent including a borohydride to convert, in a starved reaction, exposed metal oxide particles substantially uniformly distributed and at a limited concentration in the substrate. The conductive areas formed have a surface resistivity greater than $10^6$ ohms per square indicating that non-connected island areas of catalytic film are present. These conductive areas are then electrolessly metallized to a predetermined thickness suitable for the intended application. The novel process of the present invention may be advantageously utilized to selectively metallize a substrate surface with high density circuitry without degrading the electrical and physical characteristics of the base particle-filled substrate.

We claim:

1. A process for metallizing at least a first surface of a substrate, said process comprising the steps of:
    (a) forming a substrate with at least a first surface by substantially uniformly mixing a resin with a plurality of small metal oxide particles;
    (b) exposing the small metal oxide particles near the first surface;
    (c) applying an aqueous reducing agent including a borohydride to the first surface of the substrate for converting the exposed metal oxide particles to non-connected island areas of catalytic film each encompassing one or more metal oxide particles, such that the first surface has a surface resistivity greater than $10^6$ ohms per square; and (d) electrolessly metallizing the island areas of the first surface of said substrate to a predetermined thickness, whereby adjacent island areas are interconnected.

2. The process according to claim 1, wherein said resin is comprised of one or a mixture of a thermoplastic resin, thermoset resin, elastomer, composite, or laminate.

3. The process according to claim 1, wherein said resin is comprised of one or a mixture of a polyolefin, vinyl, polystyrene, polyamide, acrylic, polyurethane, or saturated polyester thermoplastic resin.

4. The process according to claim 1, wherein said resin is comprised of one or a mixture of a hardened phenolic, unsaturated polyester, epoxy, or polyimide prepolymer.

5. The process according to claim 1, wherein said reducing agent is comprised of an unsubstituted alkali metal borohydride or a substituted borohydride wherein up to three of the hydrogen atoms which comprise the borohydride ion have been replaced by inert substituents.

6. The process according to claim 1, wherein said metal oxide particles are comprised of cuprous oxide or nickel oxide.

7. The process according to claim 1, wherein said step (d) deposits metallization having a thickness of at least 4 micrometers.

8. The process according to claim 1, wherein said step (d) deposits metallization comprised of nickel, cobalt, chromium copper, iron, silver, gold, vanadium, cobalt/nickel alloy, or brass.

9. The process according to claim 1, wherein said metal oxide particles have a diameter ranging at least from 0.05 micrometers to 10 micrometers.

10. The process according to claim 1, wherein said step (a) further includes the step of reactive ion etching the first surface of said substrate for cleaning the first surface and exposing the metal oxide particles.

11. The process according to claim 1, wherein said step (a) further includes the step of chemically etching the first surface for exposing said metal oxide particles.

12. The process according to claim 1, wherein said step (a) comprises the step of controlling the percentage by weight of said metal oxide.

13. The process according to claim 12, wherein the percentage by weight of said metal oxide is less than ten percent.

14. The process according to claim 1, wherein said step (c) further includes the step of controlling the concentration of the borohydride in the reducing agent.

15. The process according to claim 14, wherein the concentration of the borohydride in the reducing agent is at least from 0.01 to 10 moles per liter.

16. The process according to claim 1, wherein said step (c) further includes the step of controlling the pH of the reducing agent.

17. The process according to claim 16, wherein the pH of the reducing agent is at least from 9 to 11.5.

18. The process according to claim 1, wherein said step (c) further includes the step of spraying the reducing agent onto the first surface of the substrate.

19. The process according to claim 18, further including the step of controlling the flow rate, duration, and pressure of said step of spraying.

20. The product of the process as defined in claim 1.

21. A process for selectively metallizing at least a first surface of a substrate comprised of a non-conductive material, said process comprising the steps of:

(a) forming a first layer on the first surface by substantially uniformly mixing a resin with a plurality of small metal oxide particles;

(b) forming a second layer on the first surface covering said first layer;

(c) selectively removing portions of said second layer to reveal corresponding portions of said first layer;

(d) exposing the small metal oxide particles near the surface of said portions of the first layer;

(e) applying, to said portions of said first layer, an aqueous reducing agent including a borohydride for converting the exposed metal oxide particles to non-connected island areas of catalytic film each encompassing one or more metal oxide particles, such that said portions of said first layer have a surface resistivity greater than $10^6$ ohms per square; and (f) electrolessly metallizing the island areas of said portions of said first layer to a predetermined thickness, whereby adjacent island areas are interconnected.

22. The process according to claim 21, wherein said resin is comprised of one or a mixture of a thermoplastic resin, thermoset resin, elastomer, composite, or laminate.

23. The process according to claim 21, wherein said resin is comprised of one or a mixture of a polyolefin, vinyl, polystyrene, polyamide, acrylic, polyurethane, or saturated polyester thermoplastic resin.

24. The process according to claim 21, wherein said resin is comprised of one or a mixture of a hardened phenolic, unsaturated polyester, epoxy, or polyimide prepolymer.

25. The process according to claim 21, wherein said reducing agent is comprised of an unsubstituted alkali metal borohydride or a substituted borohydride wherein up to three of the hydrogen atoms which comprise the borohydride ion have been replaced by inert substituents.

26. The process according to claim 21, wherein said metal oxide particles are comprised of cuprous oxide or nickel oxide.

27. The process according to claim 21, wherein said step (f) deposits metallization having a thickness of at least 4 micrometers.

28. The process according to claim 21, wherein said step (f) deposits metallization comprised of nickel, cobalt, chromium copper, iron, silver, gold, vanadium, cobalt/nickel alloy, or brass.

29. The process according to claim 21, wherein said metal oxide particles have a diameter ranging at least from 0.05 micrometers to 10 micrometers.

30. The process according to claim 21, wherein said step (a) further includes the step of reactive ion etching the first surface of said substrate for cleaning the first surface and exposing the metal oxide particles.

31. The process according to claim 21, wherein said step (a) further includes the step of chemically etching the first surface for exposing said metal oxide particles.

32. The process according to claim 21, wherein said step (a) comprises the step of controlling the percentage by weight of said metal oxide.

33. The process according to claim 32, wherein the percentage by weight of said metal oxide is less than ten percent.

34. The process according to claim 21, wherein said step (c) further includes the step of controlling the concentration of the borohydride in the reducing agent.

35. The process according to claim 34, wherein the concentration of the borohydride in the reducing agent is at least from 0.01 to 10 moles per liter.

36. The process according to claim 21, wherein said step (c) further includes the step of controlling the pH of the reducing agent.

37. The process according to claim 36, wherein the pH of the reducing agent is at least from 9 to 11.5.

38. The process according to claim 21, wherein said step (c) further includes the step of spraying the reducing agent onto the first surface of the substrate.

39. The process according to claim 38, further including the step of controlling the flow rate, duration, and pressure of said step of spraying.

40. The product of the process as defined in claim 21.

* * * * *